United States Patent [19]

Duong

[11] 4,411,931
[45] Oct. 25, 1983

[54] MULTIPLE STEP UV CURING PROCESS FOR PROVIDING ACCURATELY CONTROLLED SURFACE TEXTURE

[75] Inventor: Chau H. Duong, East Lampeter Township, Lancaster County, Pa.

[73] Assignee: Armstrong World Industries, Inc., Lancaster, Pa.

[21] Appl. No.: 426,677

[22] Filed: Sep. 29, 1982

[51] Int. Cl.³ .............................................. B05D 3/06
[52] U.S. Cl. .................................... 427/54.1; 427/44; 427/53.1
[58] Field of Search ....................... 427/44, 54.1, 53.1

[56] References Cited

U.S. PATENT DOCUMENTS 3,966,572  6/1976  Carder .
4,229,274  10/1980  Carlblom .
4,289,798  9/1981  Bagley et al. .
4,309,452  1/1982  Sachs .
4,313,969  2/1982  Matthews et al. .

OTHER PUBLICATIONS

Freid "Radiation Curing" Feb. 1982 pp. 19–25.

*Primary Examiner*—John H. Newsome
*Attorney, Agent, or Firm*—Laird F. Miller

[57] ABSTRACT

The present invention relates to a three-stage UV curing process whereby a UV-curable substrate is initially exposed to long wave length light of low intensity, thereby causing the bottom portion of the substrate to gel while leaving the top surface essentially unaffected. The first stage irradiation is followed by irradiation with shorter-wave length UV light under an inert atmosphere, thereby causing the surface of the substrate to gel. The final stage of the curing process involves conventional exposure to strong UV light whereby the entire structure is cured to give a product having finely controlled surface texture. The resulting products are useful as surface coverings, and particularly as floor and wall coverings.

10 Claims, No Drawings

MULTIPLE STEP UV CURING PROCESS FOR PROVIDING ACCURATELY CONTROLLED SURFACE TEXTURE The present invention relates to UV curing processes and more particularly to multiple step UV curing processes for preparing products having controlled surface texture.

BACKGROUND OF THE INVENTION

UV curable surfaces have come into wide use in recent years, particularly in the flooring industry. Such surfaces have proved to be tough and durable, and thus are well suited for use as protective surfaces.

Surfaces which were initially produced by UV curing were manufactured by single-stage exposure of a UV curable substrate to strong ultraviolet light. Problems in the quality of the resulting structures, however, ultimately led to modifications in the early processes, thereby giving improved products.

THE PRIOR ART

A number of U.S. patents describe processes for curing radiation-curable substrates. For example, U.S. Pat. No. 3,840,448 discloses a process for blanketing a UV curable substrate in an inert atmosphere and subjecting it to low-pressure, low-intensity mercury lamps which primarily emit a wave length of 2537 angstroms; U.S. Pat. No. 3,930,064 discloses flash irradiation of UV curable substrates at wavelengths of 1894 angstroms, 3890 angstroms and 1974 angstroms; U.S. Pat. No. 3,943,046 discloses flash photolysis as the initial radiation step, followed by sustained exposure using the same light source; U.S. Pat. No. 4,165,265 discloses a multiple step curing process using an initial wave length range of 3800–4200 angstroms, followed by irradiation with wave lengths of from 3600 to 3800 angstroms; U.S. Pat. No. 4,309,452 discloses irradiation of a first layer of UV curable material at a wave length of 2500–4000 angstroms in an oxygen-containing atmosphere, followed by application of a second layer of UV curable material which is cured in an inert atmosphere containing less than 1000 parts per million of oxygen; and U.S. Pat. No. 4,313,969 discloses gloss control through the use of inert particulate materials and irradiation at long wave lengths, followed by final curing at shorter wave lengths.

Despite these references which relate to the use of UV curable substrates, substantial difficulty is still encountered in adequately controlling surface wrinkling during exposure to ultraviolet light.

Accordingly, one objective of the present invention is to provide a technique utilizing UV irradiation whereby gross surface wrinkles are avoided and fine surface texture is obtained.

Yet another objective of the present invention is to provide a process for preparing UV-cured substrates in a routine and reproducible manner whereby the surface texture may be accurately controlled.

These and other objectives of the present invention will become apparent from the detailed description of preferred embodiments which follow.

SUMMARY OF THE INVENTION

The present invention relates to a three-stage UV curing process whereby a UV-curable substrate is initially exposed to long wave length light of low intensity, thereby causing the bottom portion of the substrate to gel while leaving the top surface essentially unaffected. The first stage irradiation is followed by irradiation with shorter-wave length UV light under an inert atmosphere, thereby causing the surface of the substrate to gel. The final stage of the curing process involves conventional exposure to strong UV light whereby the entire structure is cured to give a product having finely controlled surface texture. The resulting products are useful as surface coverings, and particularly as floor and wall coverings.

DETAILED DESCRIPTION OF PREFERRED EMBODIMENTS

In one embodiment, the present invention relates to a process for accurately controlling the surface texture of UV-curable substrates, said process comprising the steps of exposing a UV-curable substrate having a thickness of not less than about two mils to an ultraviolet light source which emits a wave length of from about 3000 to about 4200 angstroms for a period of time which will cause the bottom portion of said substrate to gel but which will have essentially no effect on the upper surface of said substrate; blanketing the partially gelled substrate with an inert gas and exposing said substrate to a low-pressure mercury ultraviolet light source to gel the upper surface of said substrate and cause development of a desired surface texture; and exposing the gelled substrate to strong ultraviolet light to effect final curing and essentially fix the surface texture.

In a second embodiment the present invention relates to a UV-cured substrate having a fixed surface texture, said substrate being obtained by exposing a UV-curable substrate having a thickness of not less than about two mils to an ultraviolet light source which emits a wave length of from about 3000 to about 4200 angstroms for a period of time which will cause the bottom portion of said substrate to gel but which will have essentially no effect on the upper surface of said substrate; blanketing the partially gelled substrate with an inert gas and exposing said substrate to a low-pressure mercury ultraviolet light source to gel the upper surface of said substrate and cause development of a desired surface texture; and exposing the gelled substrate to a strong ultraviolet light source to effect final curing and essentially fix the surface texture.

The early prior art relating to UV curing procedures using strong UV light disclosed processes which involved the total blanketing of a UV-curable surface with an inert gas in an attempt to protect the surface from oxygen. It was subsequently learned, however, that providing an inert atmosphere was necessary only until the surface of the substrate had cured, at which point the surface itself became an oxygen barrier. This procedure had definite drawbacks, however, because the surface coating shrank significantly during the curing process and the fluidity of the underlying uncured substrate allowed the surface to assume a contour that accommodated the stresses which had been induced by the curing of the surface layer. Great difficulty has been encountered in the flooring industry, in particular, in overcoming this detrimental effect.

Among the solutions which have been proposed is the use of intermediate-wave length light, such as taught in U.S. Pat. No. 3,840,448, which was referred to above. The light source is conventionally a low-pressure mercury lamp, commonly called a germicidal lamp, having an intensity of 3 watts per inch or less, which emits light primarily at a wave length of about 2540 angstroms. These lamps are usually used in combination with a nitrogen blanket to gel or "skin off" the surface of a UV-curable substrate. The light does not penetrate the substrate to any great extent, however, because the substrate itself acts as a filter for light having that wavelength. Accordingly, strong radiation is required to achieve final curing.

The procedure works well for thin coatings (i.e., coatings having a thickness of ca. 1 mil); however, where thick coatings are used (e.g. coatings from 2–15 mils thick) gross wrinkling often occurs. Thus, a method has long been sought to adequately and predictably control the surface wrinkling of UV-curable substrates.

Surprisingly, it has been discovered that the use of very low intensity, long wave length light to pre-gel the bottom layer of a relatively thick coating of UV-curable material will provide an apparent stabilization to the UV-curable structure. Thereafter, when the upper surface, which is unaffected by the long wave length light, is blanketed in an inert atmosphere and subjected to germicidal texturing lamps, a surface cure is effected in which the surface texture can be very carefully controlled. Consequently, when final cure is effected by exposing the substrate to strong UV light in a manner which is well known in the art, no further change in surface texture occurs and the existing texture is essentially fixed.

The long wave length light of the present invention will have a wave length of from about 3000 to about 4200 angstroms, but preferably of from about 3300 to about 3600 angstroms, at an intensity of not more than about 1–2 watts per inch. Light of this wave length and intensity is not filtered by the substrate; yet, in air, it is not strong enough to overcome oxygen inhibition so as to cause gellation of the surface. Therefore, the surface remains wet while internal gellation occurs. Particularly satisfactory results have been obtained using Sylvania F-20T12-BLB blue lamps which primarily emit radiation having a wave length of about 3560 angstroms. Conventional germicidal lamps and strong (medium-pressure mercury) lamps are used for the last two steps of the process, respectively.

To practice the present invention, a UV-curable substrate is passed beneath a bank of long wave length, low intensity lights to obtain gellation of the lower regions of the substrate without substantially affecting the surface. The dwell time under the lights may vary depending on a number of parameters including the number of lamps, their wave length and intensity, the distance between the lamps and the substrate, and the nature of the substrate. However, when using a light bank comprising ten of the Sylvania lamps described above, dwell times of from about 4 to about 25 seconds have been found satisfactory to cure the lower regions of a substrate which is about 6 mils thick. Nevertheless, Applicant desires to emphasize that substantially thicker coatings may also be suitably treated according to the present invention. Thus coatings from 3–15 mils, but preferably from 4–10 mils, thick may be cured as taught herein.

As the second stage of the process, the partially cured substrate is blanketed with an inert gas such as nitrogen and irradiated with conventional germicidal lamps to gel the surface and provide the desired texture. While applicant does not desire to be bound by any theory of operability, it appears that the surface texturing results from a change of volume as the surface film of the substrate converts from a liquid to a solid (gel). As with the long wave length lamps, the exposure time will vary depending on a number of parameters such as lamp intensity, the number of lamps and the like. Satisfactory results have been obtained using a bank of twelve General Electric 615T8 lamps for dwell times ranging from about 4 to about 25 seconds.

As the final step of the process, the gelled structure having the desired surface texture is exposed to high-intensity UV light to effect final curing and permanently fix the surface characteristics. It should be noted, however, that if too long a time lapse occurs between exposure to the germicidal lamps and the final cure, the structure may adjust itself during the interim so as to minimize or eliminate the texturing. Accordingly, if texturing is desired, this adjustment should not be permitted to occur.

With the aforementioned process in mind, it will be seen that the surface texturing may be varied in a number of ways. The most preferred way, however, is to vary the relative exposure times of the substrates to the long wave length lamps and the germicidal lamps. Thus, if gross surface wrinkling is desired, shorter exposure to the long wave length light would be required whereas, if fine surface texture is desired, longer exposure to the long wave length light would be required.

The advantages of the present invention will be seen from the following examples which are intended to serve as illustrations and not limitations to the practice of the present invention.

EXAMPLE 1

A solid vinyl substrate was coated with a 5-6 mil layer of a urethane-acrylate coating composition. The preparation of this composition is set forth in Example I of U.S. Pat. No. 4,289,798, the disclosure of which is herein incorporated by reference.

The coated substrate was passed beneath a series of the following radiation sources at a rate of 6 feet per minute. The first radiation sources comprised a bank of ten Sylvania F-20T12-BLB blue lamps. These lamps emit wavelengths between 3,000 and 4,200 angstroms, with a peak emission at 3,560 angstroms, at an intensity of one watt per inch. Exposure to this radiation for 22 seconds caused pre-gelling of the lower portion of the UV-curable coating.

In the second stage of the curing process, the partially gelled substrate was blanketed with nitrogen and passed beneath a bank of twelve GE 615T8 germicidal lamps which emit a wavelength of about 2540 angstroms and also have an intensity of one watt per inch. Exposure to this second stage treatment for 22 seconds resulted in gellation of the upper surface of the coating.

The final step of the curing process involved a conventional exposure of the gelled substrate to a high-intensity (300 watts per inch) UV light source by means well known in the art, resulting in complete curing of the product.

The results obtained using this sequence of steps could be varied depending on the dwell time of the substrate under the long wavelength light. Thus, if the substrate were only briefly exposed to the long wavelength radiation, significantly more surface wrinkling was obtained than if the substrate were exposed for a longer period of time to this radiation. It has been noted however, that the same effect could not be suitably achieved by limiting the number of long wave length lights. For example, using 5 rather than 10 of the Sylvania lights results in unsatisfactory gelling of the substrate. Conversely, limiting the number of germicidal lamps did not have the same detrimental effect, presumably because only the surface film is gelled by exposure to these lamps. Thus, only minor changes in texture were obtained by reducing the number of germicidal lamps from 12 to 6.

EXAMPLE 2

A conventional release paper was coated with the UV curable coating described in Example 1 and the coating was cured as described in that example, except that 6 germicidal lamps were used. No difference was noted in the results, suggesting that the nature of the support surface is immaterial to the curing of UV curable coating.

EXAMPLE 3

A floor tile was coated with the coating material described in Example 1 and the coated tile was passed through the process described in Example 1 using a conveyor speed of 20-30 feet per minute. At that speed, the substrate had a dwell time of 4.5 seconds under each bank of lamps. Twelve germicidal lamps were used during this experiment. As before, surface wrinkling could be controlled by the duration of exposure of the substrate to the long wavelength radiation.

EXAMPLE 4

The process of Example 1 was repeated using a solid vinyl support surface and a UV curable printing ink (Borden 119 POG-LUV coating) comprising acrylated urethane, N-vinylpyrrolidone and ethoxy-ethoxyethyl acrylate and having a viscosity of 1,000 cps. The same results were obtained for this UV-curable printing ink as were obtained for the UV-curable coating used in Examples 1-3.

The present invention is not restricted solely to the descriptions and illustrations provided above, but encompasses all modifications envisaged by the following claims.

What is claimed is:

1. A process for accurately controlling the surface texture of UV-curable substrates, said process comprising the steps of exposing a UV-curable substrate having a thickness of not less than about two mils to an ultraviolet light source which emits a wave length of from about 3000 to about 4200 angstroms for a period of time which will cause the bottom portion of said substrate to gel but which will have essentially no effect on the upper surface of said substrate;

blanketing the partially gelled substrate with an inert gas and exposing said substrate to a low-pressure mercury ultraviolet light source to gel the upper surface of said substrate and cause development of a desired surface texture; and exposing the gelled substrate to a strong ultraviolet light source to effect final curing and essentially fix the surface texture.

2. The invention as set forth in claim 1 hereof wherein said long wave length light source emits primarily between 3300 and 3600 angstroms.

3. The invention as set forth in claim 2 hereof wherein said light source emits at about 3560 angstroms at an intensity of about 1 watt per inch.

4. The invention as set forth in claims 1, 2 or 3 hereof wherein said substrate has a thickness of from about 3 to about 15 mils.

5. The invention as set forth in claim 4 hereof wherein said substrate has a thickness of from about 4 to about 10 mils.

6. A UV-cured substrate having a fixed surface texture, said substrate being obtained by exposing a UV-curable substrate having a thickness of not less than about two mils to an ultraviolet light source which emits a wave length of from about 3000 to about 4200 angstroms for a period of time which will cause the bottom portion of said substrate to gel but which will have essentially no effect on the upper surface of said substrate;

blanketing the partially gelled substrate with an inert gas and exposing said substrate to a low-pressure mercury ultraviolet light source to gel the upper surface of said substrate and cause development of a desired surface texture; and exposing the gelled substrate to a strong ultraviolet light source to effect final curing and essentially fix the surface texture.

7. The invention as set forth in claim 6 hereof wherein said long wave length light source emits primarily between 3300 and 3600 angstroms.

8. The invention as set forth in claim 7 hereof wherein said light source emits at about 3560 angstroms at an intensity of about 1 watt per inch.

9. The invention as set forth in claims 6, 7 or 8 hereof wherein said substrate has a thickness of from about 3 to about 15 mils.

10. The invention as set forth in claim 9 hereof wherein said substrate has a thickness of from about 4 to about 10 mils.

* * * * *